(12) United States Patent
Costa et al.

(10) Patent No.: US 12,638,481 B2
(45) Date of Patent: *May 26, 2026

(54) POWER DETECTOR WITH WIDE DYNAMIC RANGE

(71) Applicant: pSemi Corporation, San Diego, CA (US)

(72) Inventors: Damian Costa, San Diego, CA (US); Chih-Chieh Cheng, Poway, CA (US); Christopher C. Murphy, Lake Zurich (CA); Tero Tapio Ranta, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 22 days.

This patent is subject to a terminal disclaimer.

(21) Appl. No.: 18/534,003

(22) Filed: Dec. 8, 2023

(65) Prior Publication Data

US 2024/0288476 A1 Aug. 29, 2024

Related U.S. Application Data

(60) Continuation of application No. 17/845,754, filed on Jun. 21, 2022, now Pat. No. 11,846,660, which is a
(Continued)

(51) Int. Cl.
*G01R 19/25* (2006.01)
*H03F 1/02* (2006.01)
(Continued)

(52) U.S. Cl.
CPC ....... *G01R 19/2513* (2013.01); *H03F 1/0211* (2013.01); *H04B 10/07955* (2013.01); *G01R 31/40* (2013.01)

(58) Field of Classification Search
CPC .............. G01R 19/2513; H03F 1/0211; H04B 10/07955
See application file for complete search history.

(56) References Cited

U.S. PATENT DOCUMENTS

| | | | | |
|---|---|---|---|---|
| 4,990,803 A | | 2/1991 | Gilbert | |
| 5,534,813 A | * | 7/1996 | DeMicheli | G06G 7/24 |
| | | | | 327/346 |

(Continued)

OTHER PUBLICATIONS

PSEMI Corporation, Response filed in the USPTO dated Feb. 16, 2022 for U.S. Appl. No. 16/276,494, 9 pgs.
(Continued)

*Primary Examiner* — Ricky Go
(74) *Attorney, Agent, or Firm* — Steinfl + Bruno LLP

(57) ABSTRACT

A power detector with wide dynamic range. The power detector includes a linear detector, followed by a voltage-to-current-to-voltage converter, which is then followed by an amplification stage. The current-to-voltage conversion in the converter is performed logarithmically. The power detector generates a desired linear-in-dB response at the output. In this power detector, the distribution of gain along the signal path is optimized in order to preserve linearity, and to minimize the impact of offset voltage inherently present in electronic blocks, which would corrupt the output voltage. Further, the topologies in the sub-blocks are designed to provide wide dynamic range, and to mitigate error sources. Moreover, the temperature sensitivity is designed out by either minimizing temperature variation of an individual block such as the v-i-v detector, or using two sub-blocks in tandem to provide overall temperature compensation. In one aspect, active resistors are used in order to compensate for temperature variations.

22 Claims, 10 Drawing Sheets

Related U.S. Application Data division of application No. 16/276,494, filed on Feb. 14, 2019, now Pat. No. 11,385,267.

(51) Int. Cl.

| | | |
|---|---|---|
| *H04B 10/079* | (2013.01) | |
| *G01R 31/40* | (2020.01) | |

(56) References Cited

U.S. PATENT DOCUMENTS

| | | | |
|---|---|---|---|
| 6,066,976 | A | 5/2000 | Cho |
| 6,104,243 | A | 8/2000 | Viebach |
| 6,507,233 | B1 | 1/2003 | Parfenchuck |
| 6,816,987 | B1 | 11/2004 | Olson et al. |
| 7,777,552 | B1 | 8/2010 | Gilbert |
| 8,446,209 | B1 | 5/2013 | Horsky et al. |
| 10,505,501 | B2 * | 12/2019 | Gorbachov .......... H03G 3/3042 |
| 10,862,480 | B2 | 12/2020 | Murphy |
| 11,385,267 | B2 | 7/2022 | Costa et al. |
| 11,846,660 | B2 | 12/2023 | Costa et al. |
| 2004/0178840 | A1 | 9/2004 | Cirot |
| 2008/0068091 | A1 | 3/2008 | Kwan et al. |
| 2011/0237291 | A1 | 9/2011 | Kirisawa |
| 2012/0019304 | A1 | 1/2012 | Chen et al. |
| 2012/0319738 | A1 | 12/2012 | Nakamura et al. |
| 2013/0162454 | A1 | 6/2013 | Lin |
| 2016/0139187 | A1 | 5/2016 | Horanzy |
| 2016/0211031 | A1 | 7/2016 | Taigor et al. |
| 2020/0264217 | A1 | 8/2020 | Costa et al. |
| 2020/0266815 | A1 | 8/2020 | Murphy |
| 2022/0390493 | A1 | 12/2022 | Costa et al. |

OTHER PUBLICATIONS

Kugelstadt, Thomas, "Integrated Logarithmic Amplifiers for Industrial Applications", Amplifiers: Op Amps, Texas Instruments Incorporated, Analog Applications Journal, 1Q 2004, pp. 28-33, (6 pgs.).

Thangarasu, et al., "A 0.029 mm2 8 Bit/s Current-Mode AGC Amplifier with Reconfigurable Closed-Loop Control in 65 nm CMOS", IEEE, 2017, pp. 107-110 (4 pgs).

Chen, Sibin, Office Action received from the USPTO dated Jan. 28, 2020 for U.S. Appl. No. 16/276,482, 13 pgs.

Chen, Sibin, Final Office Action received from the USPTO dated Jun. 29, 2020 for U.S. Appl. No. 16/276,482, 8 pgs.

Chen, Sibin, Notice of Allowance received from the USPTO dated Sep. 10, 2020 for U.S. Appl. No. 16/276,482, 5 pgs.

Go, Ricky, Office Action received from the USPTO dated Jun. 10, 2021 for U.S. Appl. No. 16/276,494, 6 pgs.

Go, Ricky, Office Action received from the USPTO dated Nov. 17, 2021 for U.S. Appl. No. 16/276,494, 25 pgs.

Go, Ricky, Notice of Allowance received from the USPTO dated Mar. 8, 2022 for U.S. Appl. No. 16/276,494, 9 pgs.

Go, Ricky, Office Action received from the USPTO dated Mar. 2, 2023 for U.S. Appl. No. 17/845,754, 15 pgs.

Go, Ricky, Notice of Allowance received from the USPTO dated Aug. 7, 2023 for U.S. Appl. No. 17/845,754, 9 pgs.

PSEMI Corporation, Response filed in the USPTO dated Jun. 20, 2024 for U.S. Appl. No. 17/845,754, 8 pgs.

PSEMI Corporation, Response filed in the USPTO dated Sep. 6, 2023 for U.S. Appl. No. 17/845,754, 5 pgs.

PSEMI Corporation, Response filed in the USPTO dated Aug. 2, 2021 for U.S. Appl. No. 16/276,494, 7 pgs.

* cited by examiner

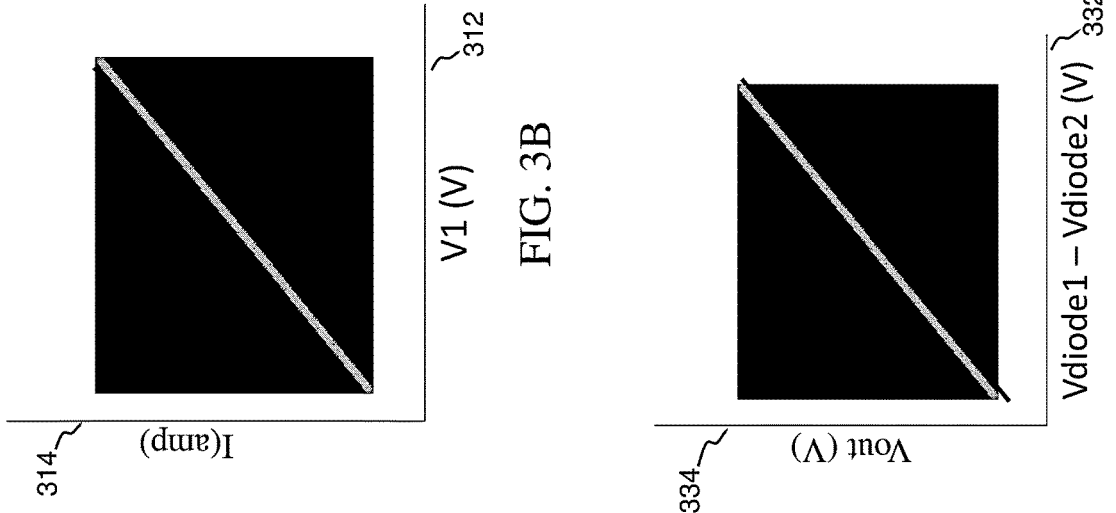
FIG. 3B
FIG. 3D
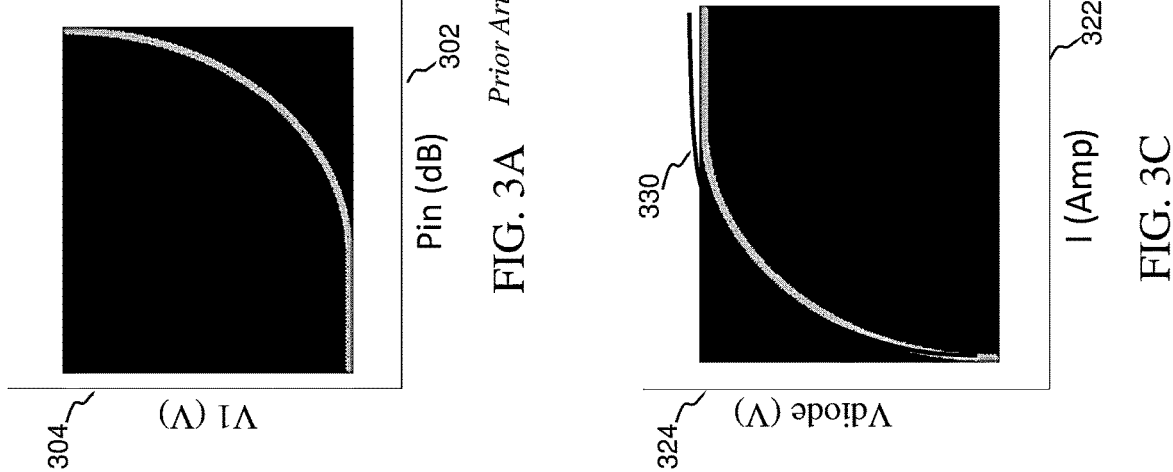
FIG. 3A
*Prior Art*
FIG. 3C

POWER DETECTOR WITH WIDE DYNAMIC RANGE

CROSS-REFERENCE TO RELATED APPLICATIONS—CLAIM OF PRIORITY

The present continuation application claims priority to the following patent application, assigned to the assignee of the present invention, the contents of which are incorporated by reference: U.S. patent application Ser. No. 17/845,754, filed Jun. 21, 2022, entitled "Power Detector with Wide Dynamic Range". application Ser. No. 17/845,754 is a divisional application, and claims priority to the following patent application, assigned to the assignee of the present invention, the contents of which are incorporated by reference: U.S. patent application Ser. No. 16/276,494, filed Feb. 14, 2019, entitled "Power Detector with Wide Dynamic Range", now U.S. Pat. No. 11,385,267, issued Jul. 12, 2022.

The present application may be related to U.S. patent application Ser. No. 16/276,482 filed on even date herewith as the present application, entitled "Controlled Active Resistance", the contents of which are incorporated herein by reference in their entirety.

BACKGROUND

(1) Technical Field

The present teachings generally relate to electronic circuits, and more specifically to a power detector circuit with wide dynamic range.

(2) Background

Generally, power detection circuitry is used in radio frequency (RF) circuits to measure power. RF circuits generally include transmitter and receiver circuits that have power requirements that vary with use. For example, the power required for signal transmission through an antenna may vary, and it is generally important to monitor the output of the transmitter during use.

When used in transmitting power control circuits, it is desirable for the power detector output voltage to be a linear function of the transmitted signal power in dBm. However, a typical power detector creates an output voltage that is linearly proportional to its input voltage, not power. Prior art power detectors realized in CMOS IC technologies generally cascade a number of stages in order to create a piecewise approximation to the desired linear-in-dB response. This approach consumes large chip die area, and consumes a large amount of current.

Accordingly, there is a need for power detector circuitry with wide dynamic range which is chip die area efficient, and which consumes a minimal amount of current.

SUMMARY

Various embodiments of a power detector circuit with wide dynamic range are disclosed. Further, various embodiments of a $V_T$-dependent resistor are disclosed. Moreover, various embodiments showing sub-blocks used in the power detector circuit with wide dynamic range are also disclosed.

In one disclosed embodiment, a power detector circuit with wide dynamic range is implemented in an integrated circuit (IC). The power detector circuit includes a linear voltage-to-voltage detector (v-v), followed by a true voltage-to-current-to-voltage (v-i-v) converter, which is then followed by an amplification stage. The current-to-voltage conversion in the voltage-to-current-to-voltage converter is performed logarithmically. This construct generates a desired linear-in-dB response at the output. This approach has several novel features: i) the distribution of gain along the signal path is optimized in order to preserve linearity and to minimize the impact of offset voltage inherently present in electronic blocks, such as an operation amplifier (OpAmp), which would corrupt the output voltage; ii) the topologies in the sub-blocks are designed to provide wide dynamic range, and to mitigate error sources; iii) temperature sensitivity is designed out by either minimizing temperature variation of an individual block such as the v-i-v converter, or using two sub-blocks in tandem to provide overall temperature compensation.

In another disclosed embodiment, the power detector circuit with wide dynamic range employs an active resistance circuitry in its last stage, in order to compensate the temperature variations in the power detector. This active resistance circuit is described in more detail in the above-mentioned U.S. patent application Ser. No. 16/276,482 filed on the same day as the present application, entitled "Controlled Active Resistance", the contents of which are incorporated herein by reference in their entirety.

In yet another embodiment, a power detector is presented, the power detector comprising a linear voltage-to-voltage detector, a voltage-to-current-to-voltage converter having a first circuital branch and a second circuital branch, wherein each branch comprises one or more diodes, and a difference amplifier having a first input coupled to a voltage across the one or more diodes of the first branch and a second input coupled to a voltage across the one or more diodes of the second branch.

BRIEF DESCRIPTION OF THE DRAWINGS

The disclosed apparatus, in accordance with one or more various embodiments, are described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

FIG. 3A shows a graph of a characteristic curve of a prior art power detector, showing the output voltage as a function of input power in dB.

FIG. 3B shows a graph of a characteristic curve of a linear voltage-to-current converter, showing the output current as a function of input voltage.

FIG. 3C shows a graph of a characteristic curve of a logarithmic function block, such as a diode, showing the voltage of the diode as a function of its current.

FIG. 3D shows a graph of a characteristic curve of an operational amplifier, showing the output voltage of the operational amplifier as a function of its input voltages.

Like reference numbers and designations in the various drawings indicate like elements.

Definitions

Figure 1:
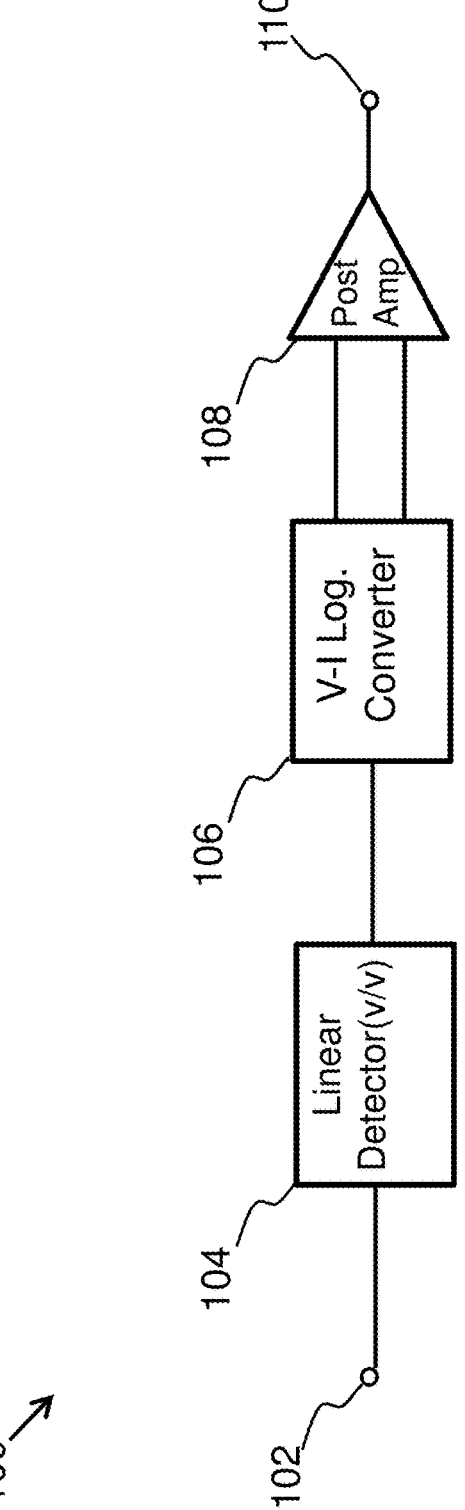
FIG. 1 shows a block diagram of a cascaded power detector with wide dynamic range in accordance with one embodiment of the disclosed apparatus.

The term thermal voltage as used throughout the present disclosure will be used to mean a voltage produced within a p-n junction due to the action of temperature. Thermal voltage depends on absolute temperature and can be given by:

$$V_T = (k \cdot T)/q$$

where:

$V_T$ = Thermal Voltage $k$ = Boltzmann's constant $T$ = Temperature in Kelvin $q$ = elementary charge$(1.602 \times 10^{-19}\text{Coulomb})$ The terms resistor, resistance, and resistive element will be used interchangeably throughout the present disclosure to indicate two-terminal electrical component that implements electrical resistance as a circuit element.

The terms active resistance and active resistor will be used throughout the present disclosure to mean compound elements within an electrical circuit that behave as a resistor, but whose behavior is controlled by another active element such as an operational amplifier, as distinguished from a passive resistor, which is an element whose behavior is purely based on its own characteristics and not controlled by another element.

The term floating resistor will be used throughout the present disclosure to mean a resistor that is referenced with respect to a voltage other than ground.

As used in the present disclosure, the term "IC" can refer to an integrated circuit or monolithic integrated circuit composed of a set of electronic circuits on one small plate ("chip") of semiconductor material such as silicon. An IC can also be referred to as a "chip".

The term decibel (symbol: dB) is a unit of measurement used to express the ratio of one value of a physical property to another on a logarithmic scale. It can be used to express a change in value (e.g., +1 dB or −1 dB) or an absolute value. In the latter case, it expresses the ratio of a value to a reference value; when used in this way, the decibel symbol should be appended with a suffix that indicates the reference value, or some other property. For example, if the reference value is 1 volt, then the suffix is "V" (e.g., "20 dBV"), and if the reference value is one milli-watt, then the suffix is "m" (e.g., "20 dBm"). The term dBm is a unit of measurement of power. Power, in dBm, is expressed as:

$$P_{dBm} = 10\log(1000 * V^2/R)$$

where V is rms voltage value and R is resistance value.

As used in the present disclosure, the term "dynamic range" refers to the ratio of the highest signal level a circuit, component, or system can handle, in dB relative to 1 mW of power (dBm), to the lowest signal level it can handle (in dBm). The term "wide dynamic range" refers to a circuit's large dynamic range, for example 20-30 dB.

As used in the present disclosure, the term "linear behavior" of a circuit refers to a behavior of the output signal of the circuit which is in direct proportion to the input signal. In a linear circuit, the output-to-input signal amplitude ratio is the same. In a circuit that exhibits linearity, the output-versus-input signal amplitude graph appears as a straight line.

DETAILED DESCRIPTION

FIG. 1 shows a block diagram of a cascaded power detector with wide dynamic range in accordance with one embodiment of the disclosed apparatus. The cascaded power detector includes a linear voltage-to-voltage detector 104, followed by a voltage-to-current-to-voltage converter 106, which is followed by a post amplification stage 108. The current-to-voltage conversion in the converter 106 is performed logarithmically. A signal enters input terminal 102 and exits through output terminal 110. The operation of the power detector 100 and its sub-blocks is described in more detail below.

Figure 2:
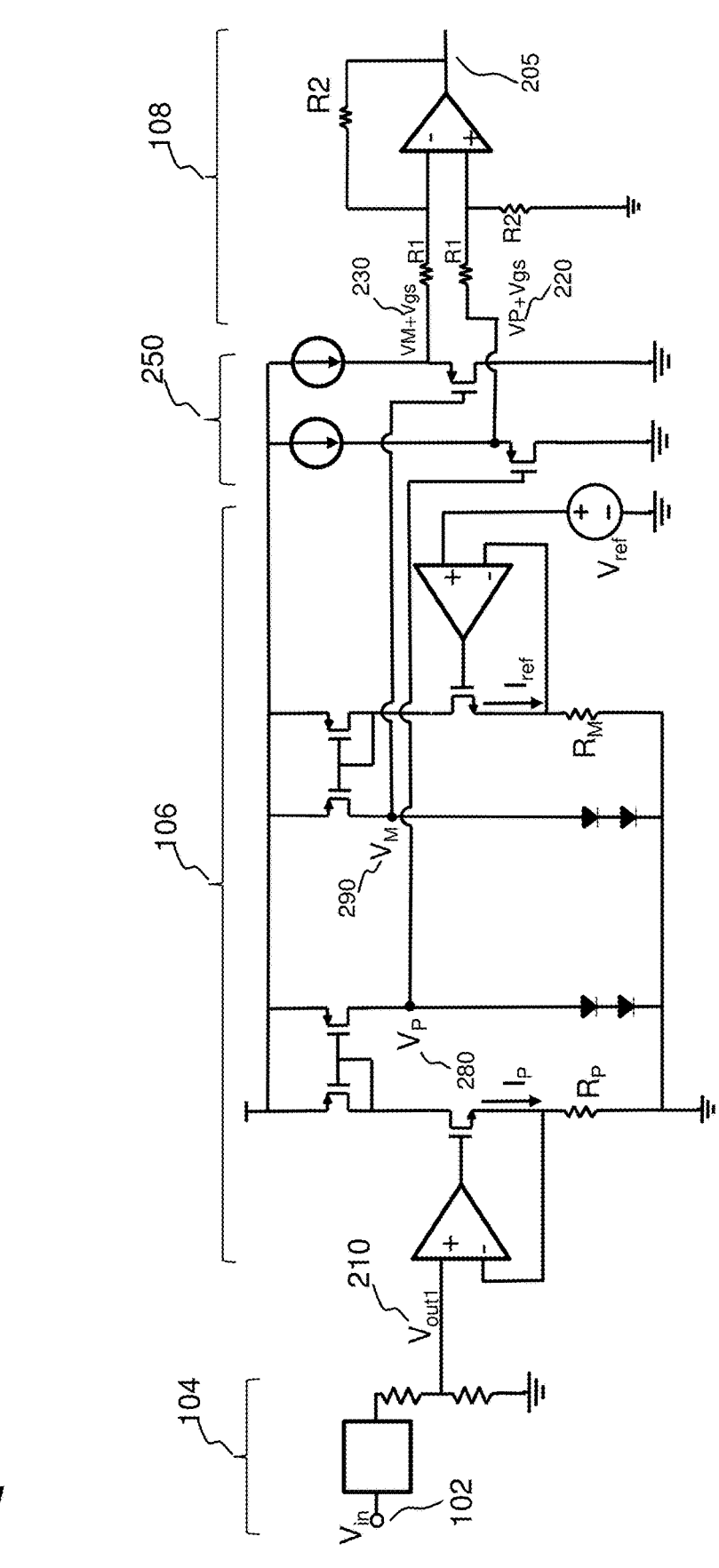
FIG. 2 shows an overall electrical schematic of the cascaded power detector with wide dynamic range of FIG. 1.

FIG. 2 shows an overall electrical schematic of the cascaded power detector of FIG. 1. Starting from the left side of the schematic, a linear voltage-to-voltage detector block 104 receives an input voltage Vin at input terminal 102. The output of the linear detector block 210 is fed into an input of the voltage-to-current-to-voltage converter 106. The current-to-voltage conversion in converter 106 is performed logarithmically. The voltage-to-current-to-voltage converter 106 generates voltages 280 $V_P$ and 290 $V_M$. These voltages are then buffered/level shifted by the buffer/level shifter 250, and fed into the input terminals 220 and 230, respectively, of a difference amplifier 108. Finally, the difference amplifier 108 amplifies the difference of the voltages at its input nodes, and produces an output voltage 205 at its output terminal. Further details of the operation of each sub-block will be provided in the following sections.

FIG. 3A shows a graph of a characteristic curve 310 of a prior art power detector, showing the output voltage as a function of input power in dB. While the prior art power detector is functional, its transfer curve 310 is not linear-in-dB, thus a transformation circuit is needed to bend the transfer curve such that the transfer curve becomes a straight line, meaning that the output voltage as a function of input power need to become linear-in-dB.

In accordance with one embodiment of the disclosed apparatus, the bending of the transfer curve is enabled through having another circuit block in series with the incoming signal, such that the other circuit block has a logarithmic transfer function. Such a logarithmic transfer function can be had in a diode. Prior to utilizing the logarithmic transfer function of a diode, the voltage needs to be converted to a current.

FIG. 3B shows a graph of a characteristic curve 320 of a linear voltage-to-current converter, showing the output current as a function of input voltage. As depicted in FIG. 3A, a linear transfer function is shown. The transfer function is given by:

$$I_1 = kV_1$$

FIG. 3C shows a graph of a characteristic curve 330 of a logarithmic function block, such as a diode, showing the voltage of the diode as a function of its current. The current flowing through a diode is an exponential function of its voltage drop, which can be employed to perform the desired transformation. The transfer function is given by:

$$I = I_s \left( e^{\frac{V_d}{nV_T}} - 1 \right)$$

where $V_d$ is the diode voltage drop, and $V_T$ is the thermal voltage. This is the expression for diode current as a function of diode voltage. When using diode current as the input and diode voltage as the output, a logarithmic expression results:

$$Vd = nVt * \ln(I/Is + 1)$$

The diode is used this way in the present application, where a current is fed into the diode and the resulting voltage is the output. The logarithmic response of the diode counteracts the exponential response of the detector to create a substantially linear output. It will be understood by those skilled in the art that "substantially linear" is defined as the output being a straight line as a function of the input over a desired range of operation.

FIG. 3D shows a graph of a characteristic curve 340 of an operational amplifier, showing the output voltage of the operational amplifier as a function of its input voltages. Once a linear-in-dB transformation is achieved, a difference operational amplifier (OpAmp) can be used to achieve a wide range of output voltage. The transfer function is given by:

$$V_{o2} = A(V_{D1} - V_{D1})$$

where $V_{D1}$ and $V_{D2}$ are voltages across diodes within the voltage-to-current-to-voltage converter 106.

Figure 4:
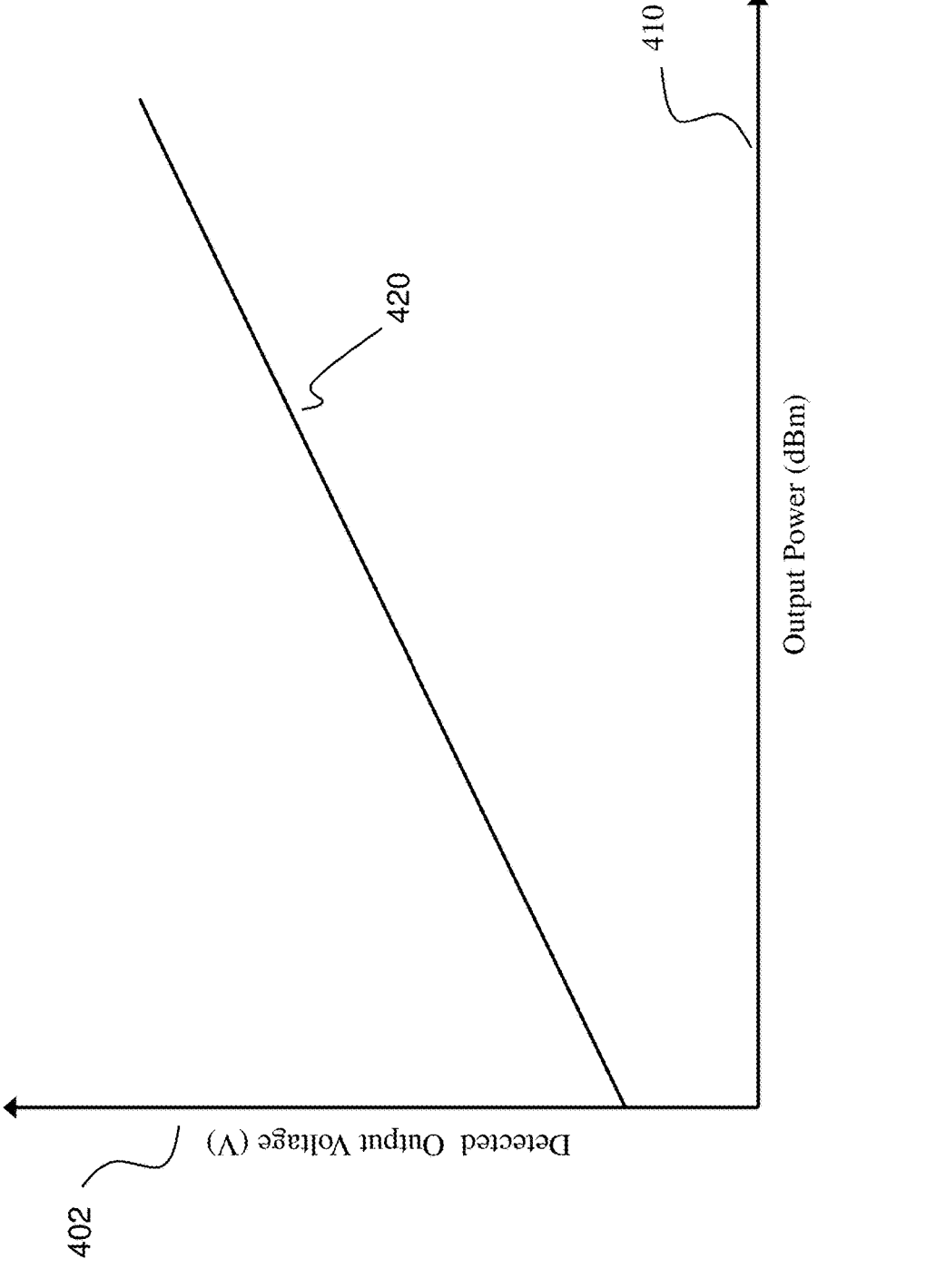
FIG. 4 shows a graph of a characteristic curve of a cascaded power detector with wide dynamic range in accordance with one embodiment of the disclosed apparatus, showing a detected output voltage as a function of output power in dB.

FIG. 4 shows a graph of a characteristic curve 420 of a cascaded power detector with wide dynamic range in accordance with one embodiment of the disclosed apparatus, showing a detected output voltage as a function of output power in dB. It can be seen that after the transformation of characteristics curves discussed in FIGS. 3A to 3D, a linear-in-dB output voltage as a function of output power can be achieved.

Further details of the operation of each sub-block within the cascaded power detector 100 will now be described in the following figures.

Figure 5:
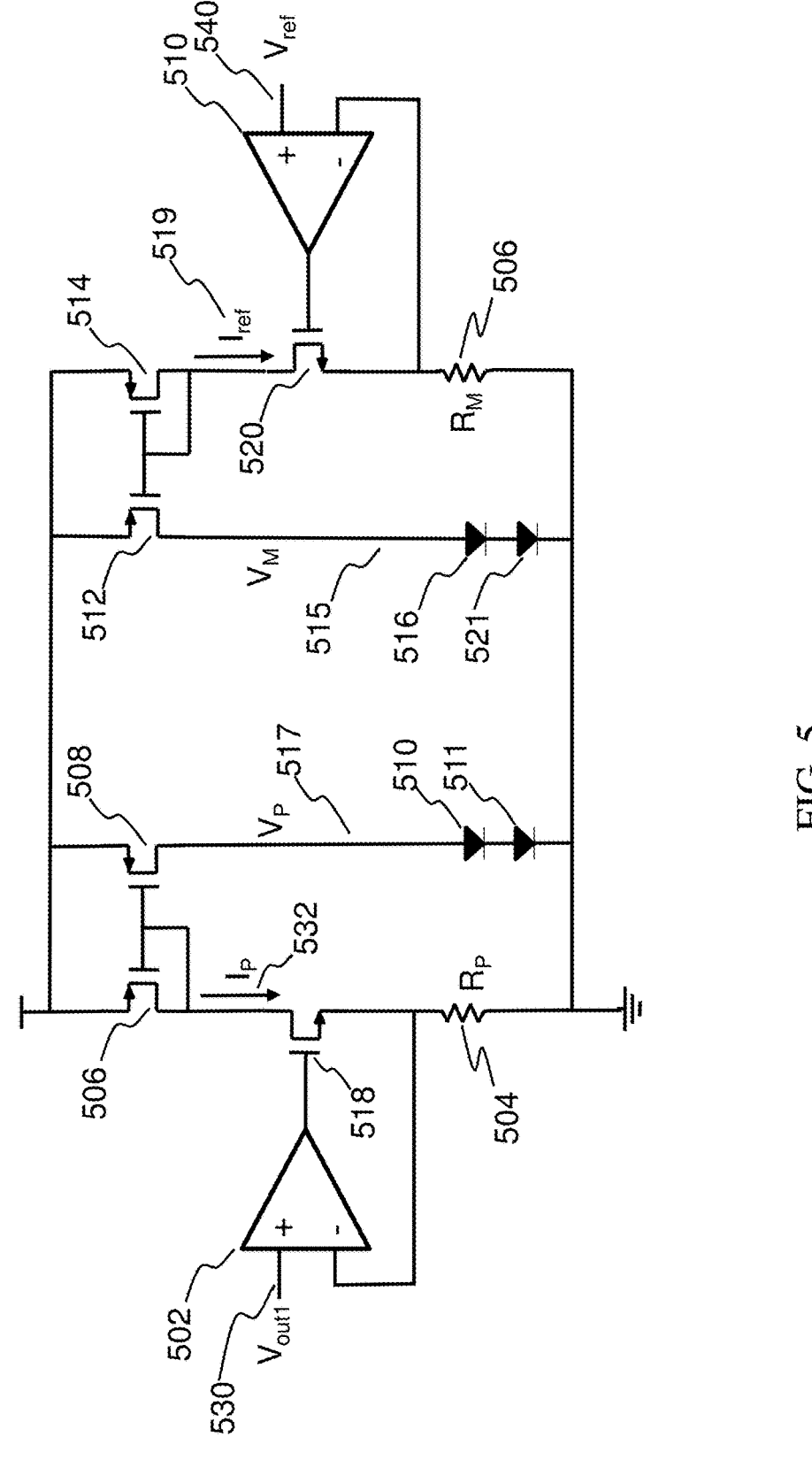
FIG. 5 shows an electrical schematic of a voltage-to-current-to-voltage converter in accordance with a preferred embodiment of the disclosed apparatus, wherein the current-to-voltage conversion is performed logarithmically.

FIG. 5 shows an electrical schematic of a voltage-to-current-to-current converter 106 in accordance with a preferred embodiment of the disclosed apparatus. The current-to-voltage conversion in converter 106 is performed logarithmically. OpAmp 502, transistor 518, resistor 504, OpAmp 510, transistor 520, and resistor 506, in combination, act to form a precise and linear voltage-to-current and then current to voltage converter. The voltage at the input of OpAmp 502 is transposed onto resistor 504 with a value $R_P$, generating a current 532 ($I_P$). The inclusion of transistor 518 allows for the current 532 to be constant while the voltage at the transistor 518 drain can vary. Current 532 is then mirrored onto diodes 510 and 511 by a current mirror formed by transistors 506 and 508. A reference current 519 is generated by OpAmp 510 by transposing a reference voltage $V_{ref}$ (540) onto the resistor 506, with a value $R_M$, generating the current 519 ($I_{ref}$). The reference voltage could be a fixed voltage source or a programmable voltage source. The reference current 519 is mirrored onto diodes 516 and 521 by a current mirror formed by transistors 512 and 514. The addition of a second reference branch 515 and taking the output voltage differentially cancels out the diode saturation current. Therefore:

$$V_P - V_M \approx 2 V_T \cdot \ln\left(\frac{I_P}{I_{ref}}\right) \qquad \text{Eq. 1}$$

Furthermore, the stacking of two diodes in series in branches 515 and 517, allows for the doubling of the output voltage of the voltage-to-current-to-voltage converter 106. This allows the gain of the last stage, i.e. the post amplifier, to be reduced by half, thus mitigating the impact of the post amplifier's offset voltage at the output. Generally, offset voltage in electronic blocks, such as operational amplifiers, can corrupt the signal, therefore it is desirable to minimize offset voltage as much as possible. It will be understood by those skilled in the art that this stacking technique cannot be carried out without limitations, because the common mode voltage of the post amplifier sets the upper limit for this technique. It should be noted that many circuit parameters can be modified to adjust the overall response. For example, one may adjust the reference current (519) relative to the signal current (517) by adjusting the ratio of resistor values (504 and 506) or adjust the voltage output by adjusting the relative size of the diodes (510 and 511 compared to 516 and 521).

The voltage $V_{out1}$ at the input node 530 of OpAmp 502 is generated by a resistor divider in sub-block 104. The resistor divider in sub-block 104 shifts the range of $V_{out1}$ such that it is compatible with the input of OpAmp 502. The value of $V_{out1}$ is given by:

$$V_{out1} = k_1 V_{in} \qquad \text{Eq. 2}$$

where $k_1$ is the transfer function of the linear voltage-to-voltage detector 104. Combining Eq. 1 and Eq. 2, and the definition of $V_T = (k \cdot T)/q$ yields:

$$V_P - V_M \approx 2\frac{kT}{q} \cdot \ln\left(\frac{k_1 V_{in}}{V_{ref\_v2i}} \frac{R_M}{R_P}\right)$$ Eq. 3

As can be seen, while the desired logarithmic function-ality has been generated, a linear, positive temperature term has been added as a side effect.

Figure 6:
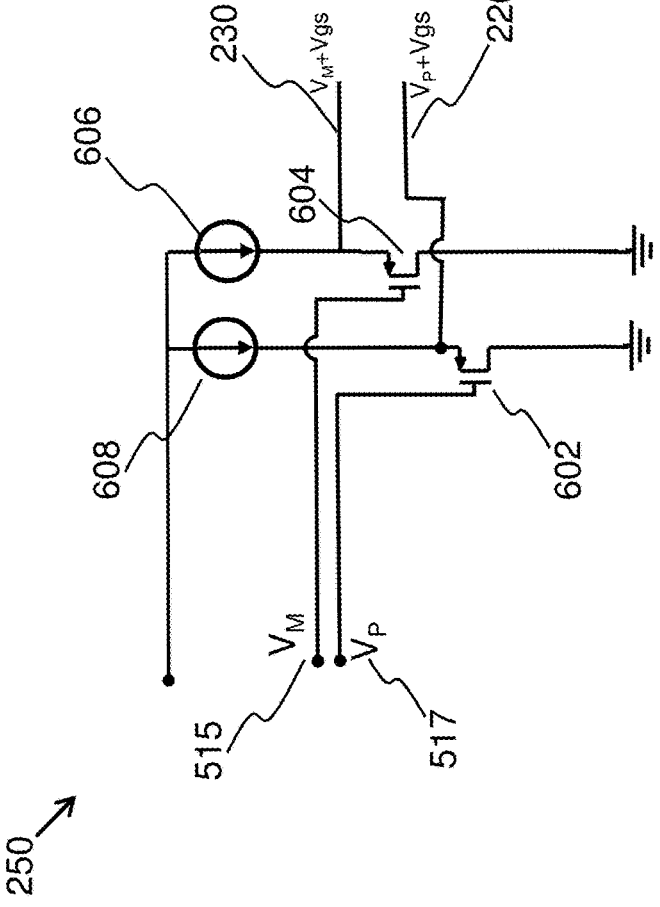
FIG. 6 shows an electrical schematic of a buffer/level shifter circuit.

FIG. 6 shows an electrical schematic of the buffer/level shifter circuit 250 in FIG. 2. This buffer/level shifter stage includes a pair of transistors 602 and 604, which are biased properly by current sources 608 and 606, respectively. The voltage at node 517 $V_P$ is buffered and level shifted by transistor 602, resulting in a voltage at node 220 of $V_P+Vgs$. Similarly, the voltage at node 515 $V_M$ is buffered and level shifted by transistor 604, resulting in a voltage at node 230 of $V_M+Vgs$.

Figure 7:
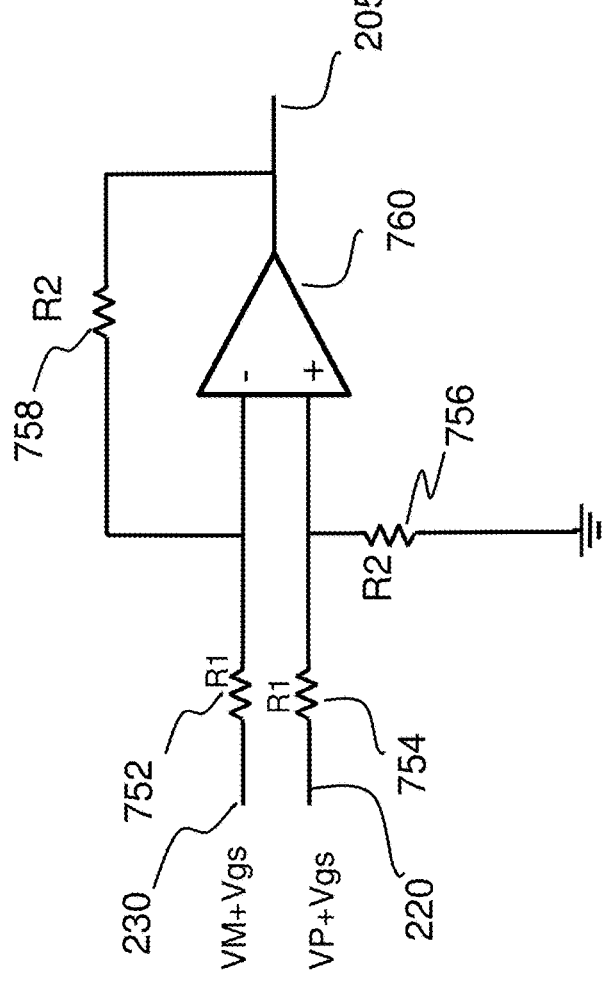
FIG. 7 shows an electrical schematic of a difference amplifier in accordance with certain embodiments of the disclosed apparatus.

FIG. 7 shows an electrical schematic of a difference amplifier 108 in accordance with certain embodiments of the disclosed apparatus. This post amplification stage receives the voltages at nodes 220 and 230 from the buffer/level shifter stage 250, scales the differential output of the volt-age-to-current-to-voltage converter 106, and performs dif-ferential-to-single-end conversion. The voltage at node 205 Vout of the difference amplifier is given by:

$$V_{out} = \frac{R_2}{R_1}(V_P - V_M)$$ Eq. 4

Combining Eq. 3 and Eq. 4 results in:

$$V_{out} = 2\frac{kT}{q}\frac{R_2}{R_1} \cdot \ln\left(\frac{k_1 V_{in}}{V_{ref\_v2i}} \frac{R_M}{R_P}\right)$$ Eq. 5

In order to achieve temperature compensation, the term R2/R1 can be used to cancel out the variations in tempera-ture T by employing resistor types with opposite temperature coefficients. The table below provides an example of tem-perature coefficients for these resistors:

TABLE 1

| Resistor | Temp Coef. |
|----------|-----------|
| $R_P$ | 0 |
| $R_M$ | − |
| $R_1$ | + |
| $R_2$ | − |

+ signifies positive temperature coefficient.
− signifies negative temperature coefficient.
0 signifies no temperature coefficient.
In this exemplary embodiment, $R_2$ and $R_1$ have been chosen to have opposite temperature coefficients. Different types of resistors, for example resistors fabricated out of polysilicon or active diffusion, have different temperature coefficients.

Majority of temperature compensation is achieved by choosing different types of resistors for $R_1$ and $R_2$, with $R_1$ having a positive (+) temperature coefficient and $R_2$ having a negative (−) temperature coefficient. This results in the term $T*R_2/R_1$ becoming independent of temperature varia-tions. The drawback of using different resistor types is that their absolute values will not track with process, because of the fact that process variations cause different types of resistors to have dissimilar variations.

To address this issue, an active resistor can be utilized where its resistance is made proportional to temperature. This active resistor is described in more detail in the above-mentioned U.S. patent application Ser. No. 16/276, 482 filed on the same day as the present application, entitled "Controlled Active Resistance", the contents of which are incorporated herein by reference in their entirety.

Figure 8:
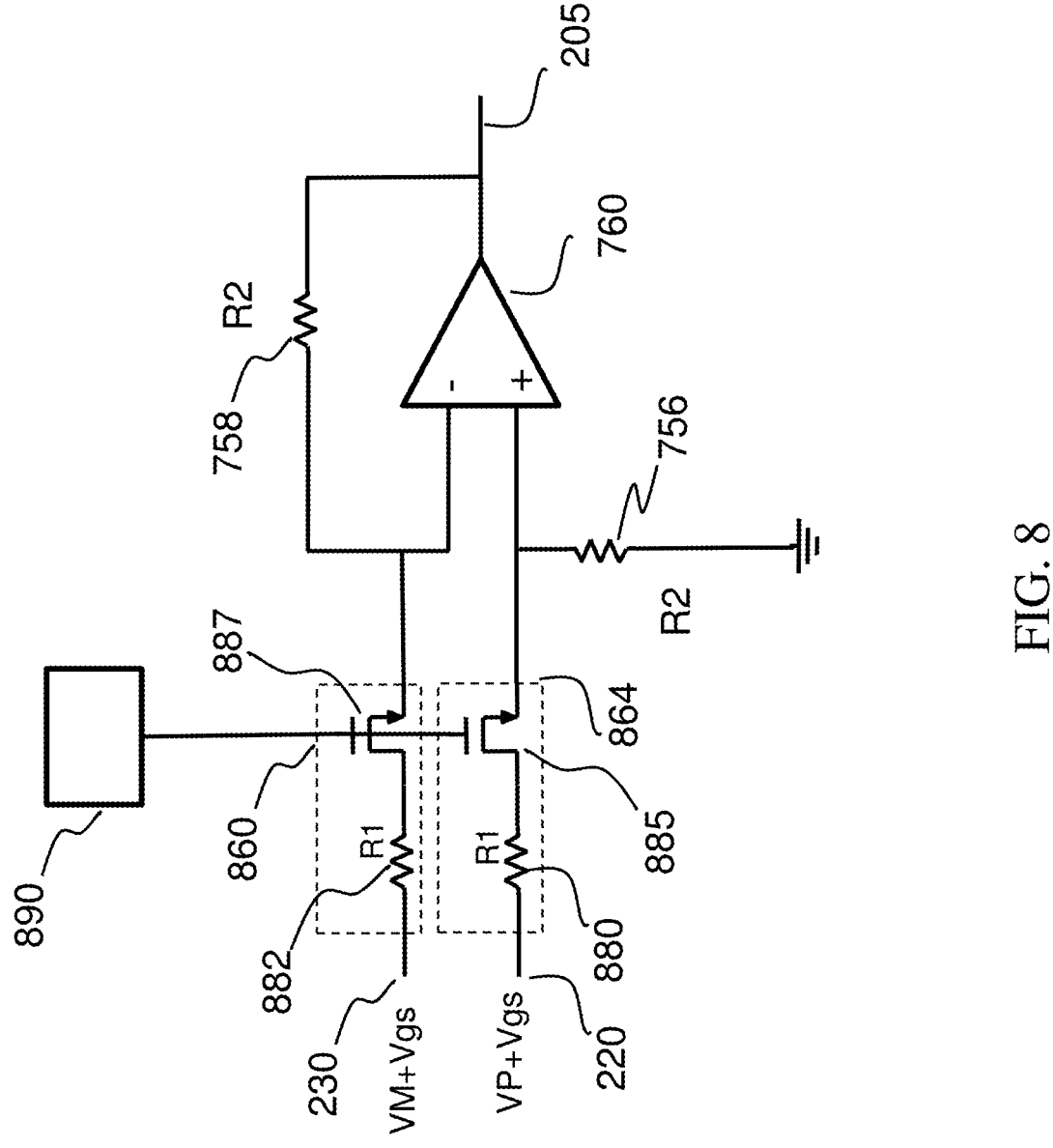
FIG. 8 shows an electrical schematic of a difference amplifier using active resistance in accordance with an alternate embodiment of the disclosed apparatus. This circuit is described in more detail in the above-mentioned U.S. patent application Ser. No. 16/276,482 filed on the same day as the present application, entitled "Controlled Active Resistance", the contents of which are incorporated herein by reference in their entirety.

FIG. 8 shows an electrical schematic of a difference amplifier using active resistance in accordance with an alternate embodiment of the disclosed apparatus. This cir-cuit is described in more detail in the above-mentioned U.S. patent application Ser. No. 16/276,482 filed on the same day as the present application, entitled "Controlled Active Resis-tance", the contents of which are incorporated herein by reference in their entirety. In FIG. 8, resistors 752 and 754 of FIG. 7 have been replaced by active resistors 860 and 864, respectively. Active resistor 860 includes a passive resistor 882 and a transistor 887. Active resistor 864 includes a passive resistor 880 and a transistor 885. The transistors 885 and 887 are controlled by a servo bias circuit 890.

Resistor $R_1$ in the difference amplifier has been replaced with $R_{active} \propto T*R_T$, where $R_T$ is the same type as $R_2$. This active resistor is based on the same resistor type as $R_2$ and thus has the same process variations but includes a tempera-ture coefficient. It is not necessary that the resistor be the same type as $R_2$, but matching resistor types does help remove process variation. The use of active floating resistors allows for the use of the same type of resistors, and for the compensation of temperature variations. Thus, the output of the power detector becomes:

$$V_{out} \propto 2\frac{kT}{q}\frac{R_2}{TR_T} \cdot \ln\left(\frac{k_1 V_{in}}{V_{ref\_v2i}} \frac{R_M}{R_P}\right)$$ Eq. 6

As can been seen in Eq. 6, the main temperature dependence is cancelled out and only one type of resistor can be used for $R_2$.

Figure 9:
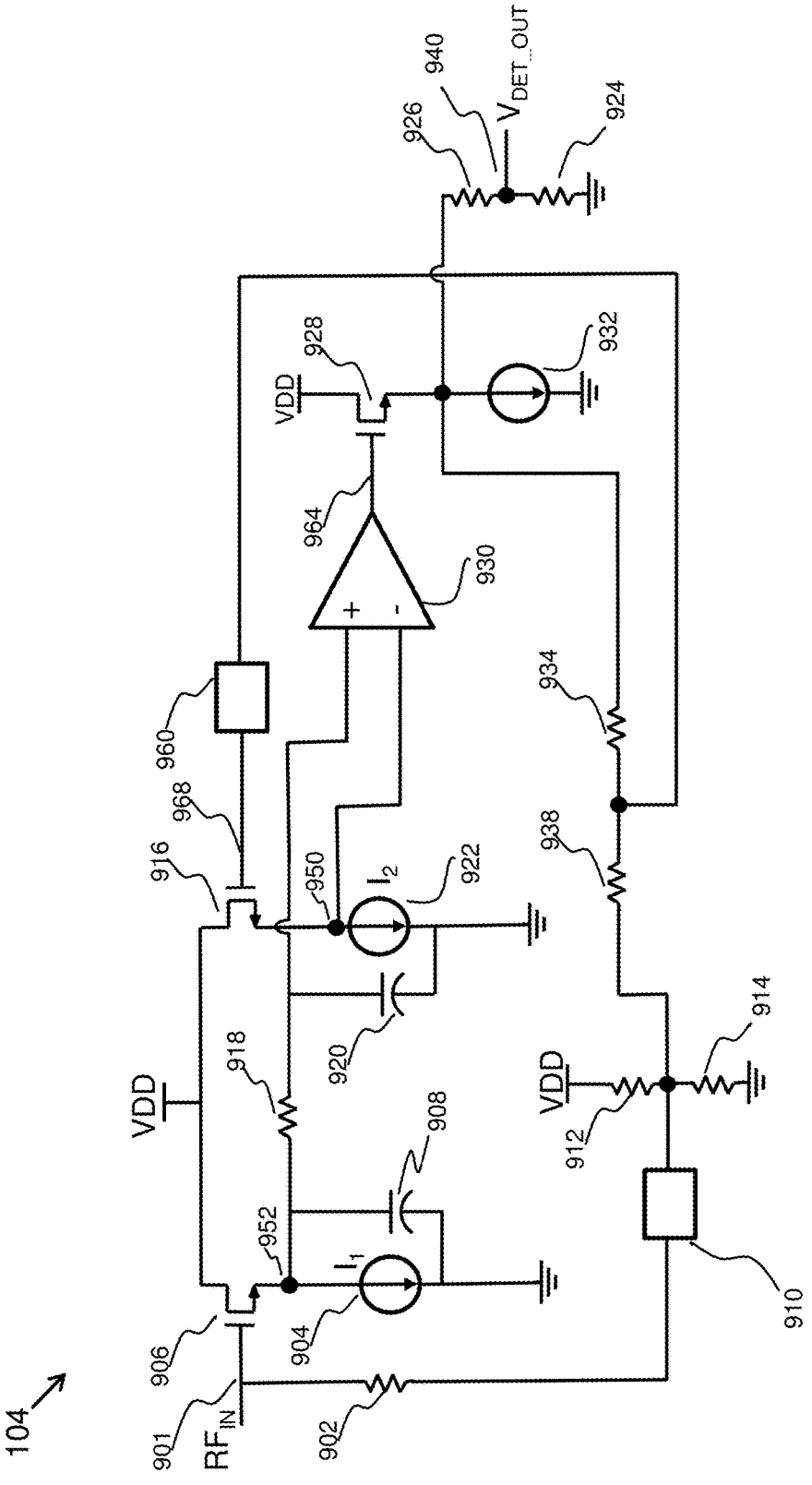
FIG. 9 shows an electrical schematic of a linear detector with wide dynamic range.

We now describe in more detail the linear voltage-to-voltage detector 104. FIG. 9 shows an electrical schematic of the linear voltage-to-voltage detector 104. Transistor 906, current source 904 and capacitor 908 form a rectifier circuit that can extract the peak or the envelope of an RF input signal at node 901. The pseudo-replica transistor 916 and current source 922, along with OpAmp 930 allow for a first order cancellation of the dc voltage and cancellation of distortion of transistor 906, and cancels out the temperature coefficient variations. The OpAmp 930 keeps the voltage at node 952 at the same value as the voltage on node 950 by driving the gate of the transistor 916 to be a scaled version of the envelope of the voltage at gate of transistor 906. Block 960 provides for level shifting of the signal. The voltage fed back to the gate of transistor 916 is scaled from the voltage at node 964 by a ratio given by RF1/(RF1+RF2), where RF1 is the value of the resistor 934, and RF2 is the value of the resistor 938. This scaling optimizes the rate of change of the voltage at node 968 with respect to the RF input signal at node 901 over process and temperature variations. This in turn keeps the output voltage of the OpAmp 930 from hitting the voltage rails for large input signals at node 901. Block 910 provides for level shifting of the signal fed back to the input signal at node 901.

The gate to source voltage of the transistor 906 ($V_{GS1}$) is not exactly equal to the gate to source voltage of the transistor 916 ($V_{GS2}$) because of the fact that there exists an RF input signal at node 901, and the fact that the feedback loop only operates at the envelope frequency of the RF input signal, i.e. the feedback loop is slow compared to the rate of change in the RF input signal at node 901. This difference between $V_{GS1}$ and $V_{GS2}$ leads to an error in the detector transfer characteristics for small RF input voltages. Optimization of the ratio of the value of resistors 912 to 914, which form a resistor divider which sets the bias point for transistor 906 when no signal is present, can be used to improve the detector's sensitivity. The resistor divider formed by resistors 926 and 924 provides the output of the linear voltage-to-voltage detector 104, such that the next stage receiving the output voltage of the linear voltage-to-voltage detector 104 works seamlessly with the linear voltage-to-voltage detector 104.

Figure 10:
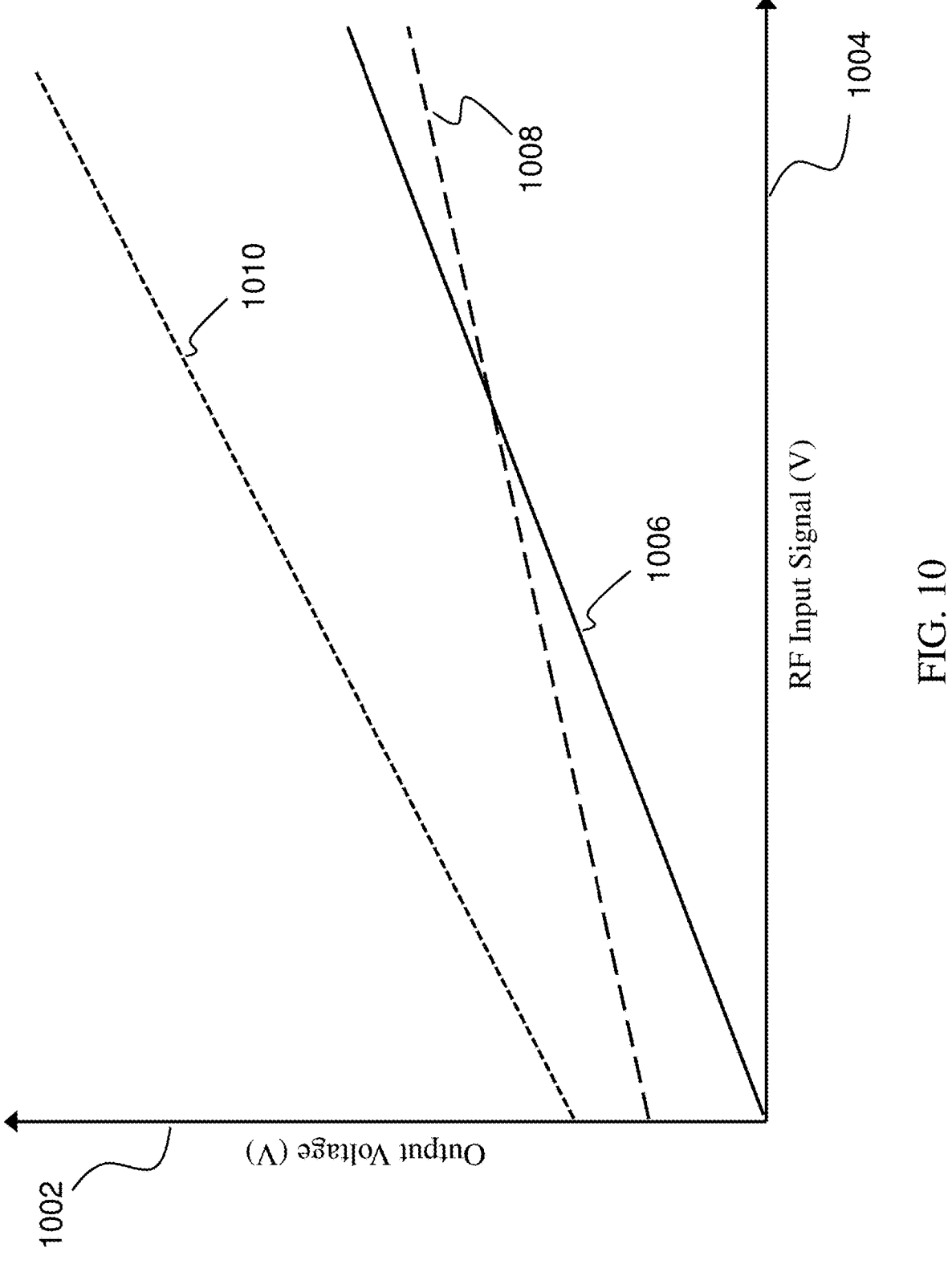
FIG. 10 shows a graph of characteristic curve of the linear detector of FIG. 8.

FIG. 10 graph further details the operation of the linear voltage-to-voltage detector 104. This graph shows the transfer function of the linear voltage-to-voltage detector 104. The X-axis 1004 shows the input RF signal at node 901 and the Y-axis 1002 shows the voltage at the output of the linear voltage-to-voltage detector 104. The voltage at node 952 of FIG. 9 is plotted as 1008. The voltage at node 964 of FIG. 9 is plotted as 1010, and the voltage at node 940 of FIG. 9 is plotted as 1006. As can been seen in FIG. 10, the voltage at node 952, which essentially follows the input RF signal, is transformed into 1010, which has better sensitivity, and scaled to have larger voltage range. The output voltage of the linear detector 1006 is then created by a source follower configuration from the voltage at the output of the OpAmp 1010.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A power detector comprising:
   a voltage-to-current-to-voltage converter having a first branch and a second branch, wherein each branch comprises one or more diodes, and
   a differential amplifier comprising:
      a first input coupled to the one or more diodes of the first branch;
      a second input coupled to the one or more diodes of the second branch;
   a temperature compensating element configured to temperature compensate the power detector, and
   wherein the temperature compensating element comprises:
      a first resistive element coupling the first input of the differential amplifier to a first terminal of the one or more diodes of the first branch, and
      a second resistive element coupling the second input of the differential amplifier to a first terminal of the one or more diodes of the second branch.

2. A power detector comprising:
   a voltage-to-current-to-voltage converter having a first branch and a second branch, each branch comprising one or more diodes;
   a differential amplifier comprising a first input and a second input, the first input of the differential amplifier being coupled to the one or more diodes of the first branch and the second input of the differential amplifier being coupled to the one or more diodes of the second branch; and
   a temperature compensating element comprising:
      a first resistive element coupling the first input of the differential amplifier to a first terminal of the one or more diode of the first branch, and
      a second resistive element coupling the second input of the differential amplifier to a first terminal of the one or more diode of the second branch.

3. The power detector of claim 2, further comprising a third resistive element connecting an output of the differential amplifier to the first input of the differential amplifier.

4. The power detector of claim 3, wherein the first, the second and the third resistive elements are passive resistors.

5. The power detector of claim 3, wherein a temperature coefficient of the first resistance element and the second resistance element has an opposite sign of a temperature coefficient of the third resistive element.

6. The power detector of claim 3, wherein the first resistive element and the second resistive element are active resistors.

7. The power detector of claim 6, where in the active resistors comprise metal-oxide-semiconductor field-effect transistor (MOSFETS).

8. The power detector of claim 3, further comprising a first current mirror and a second current mirror, and wherein:

the voltage-to-current-to-voltage is configured to receive an input voltage at a first input terminal and a reference voltage a second input terminal;

the first current mirror is configured to transpose the input voltage to a first current onto the one or more diodes of the first branch, thereby generating a first voltage at the first terminal of the one or more diodes of the first branch, and the second current mirror is configured to transpose the reference voltage to a second current onto the one or more diodes of the second branch, thereby generating a second voltage at the first terminal of the one or more diodes of the second branch.

9. The power detector of claim 8, wherein the input voltage and the reference voltage are each received via a respective operational amplifier.

10. The power detector of claim 9, further comprising a buffer/level shifter coupling:

the first terminal of the one or more diodes of the first branch to the first input of the differential amplifier, and the first terminal of the one or more diodes of the second branch to the second input of the differential amplifier.

11. The power detector of claim 10, wherein the buffer/level shifter includes a pair of transistors, each transistor of the pair of transistors being biased by a respective current source.

12. The power detector of claim 11, wherein a second terminal of each of the one or more diodes of the first and the second branches is ground.

13. The power detector of claim 1, further comprising a linear voltage-to-voltage converter disposed upstream of the voltage-to-current-to-voltage converter.

14. The power detector of claim 13, configured to provide a wide dynamic range for a signal input to the power detector.

15. The power detector of claim 14, where in the wide dynamic range is within a range of 20 to 30 dB.

16. The power detector of claim 1, further comprising a third resistive element connecting an output of the differential amplifier to the first input of the differential amplifier, wherein a temperature coefficient of the first resistance element and the second resistance element has an opposite sign of a temperature coefficient of the third resistive element.

17. The power detector of claim 16, wherein the first resistive element and the second resistive element comprise metal-oxide-semiconductor field-effect transistor (MOSFETS).

18. A method of operating a power converter, the power converter including a voltage-to-voltage converter and a differential amplifier, the method comprising:

connecting and input and an output terminal of the differential amplifier via a feedback resistor;

providing an input resistor having a temperature coefficient with an opposite sign of a temperature coefficient of the feedback resistor;

connecting the voltage-to-voltage converter to the differential amplifier via the input resistor;

applying an input signal to voltage-to-voltage converter to generate an output voltage at an the output terminal of the differential amplifier.

19. The method of claim 18, wherein the power detector is configured to provide a wide dynamic range for the input signal.

20. A method of operating a power converter, the power converter including a voltage-to-voltage converter and a differential amplifier, the method comprising:

connecting the voltage-to-voltage converter to the differential amplifier via an active resistor;

configuring the active resistor to temperature compensate the power converter.

21. The method of claim 20, wherein the active resistor includes MOSFETs.

22. The method of claim 20, wherein the power converter is configured to provide a response that is linear from a logarithmic power input to the output voltage over a desired range of operation.

* * * * *